(12) United States Patent
Kumakura

(10) Patent No.: US 7,046,184 B2
(45) Date of Patent: May 16, 2006

(54) ANALOG/DIGITAL CONVERTER FOR DETECTING COINCIDENCE OR NON-COINCIDENCE BETWEEN DATA AND A MICRO-COMPUTER INCLUDING THE ANALOG/DIGITAL CONVERTER

(75) Inventor: Kazunori Kumakura, Tochigi-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/990,377

(22) Filed: Nov. 18, 2004

(65) Prior Publication Data

US 2005/0104761 A1  May 19, 2005

(30) Foreign Application Priority Data

Nov. 18, 2003 (JP) ............................ P2003-387861

(51) Int. Cl.
*H03M 1/12* (2006.01)
(52) U.S. Cl. ..................................... 341/155
(58) Field of Classification Search ................ 341/155, 341/141, 161
See application file for complete search history.

(56) References Cited

U.S. PATENT DOCUMENTS 4,847,752 A * 7/1989 Akashi ....................... 710/48
5,095,353 A * 3/1992 Suzuki et al. ............... 348/184
5,229,770 A * 7/1993 Nakajima .................... 341/161
5,331,324 A * 7/1994 Nakajima .................... 341/141

FOREIGN PATENT DOCUMENTS

JP 05-134807 6/1993
JP 2002-261609 9/2002

* cited by examiner

*Primary Examiner*—Jean Bruner Jeanglaude
(74) *Attorney, Agent, or Firm*—Oblon, Spivak, McClelland, Maier & Neustadt, P.C.

(57) ABSTRACT

An analog/digital converter and a micro-computer including the analog/digital converter that may accurately perform "coincidence detection" operation between A/D converted digital data and a reference digital value. The analog/digital converter includes a converted data storing unit configured to store the A/D converted digital data, a reference value storing unit configured to store the reference digital value for executing a predetermined process in a CPU, and a comparing data storing unit configured to store comparing data that indicates which bit of the converted digital data is to be compared with which bit of the reference digital value. The analog/digital converter selects comparing bits from the converted digital data and the reference digital value, based on the comparing data. The analog/digital converter compares the selected bit between the converted data and the reference value and generates an interrupt request signal to the CPU at a time when coincidence as a result of the comparison is detected.

12 Claims, 12 Drawing Sheets

FIG. 3A

| CONVERTED DATA STORING REGISTER | BIT | DATA |
|---|---|---|
| | a1 | 1 |
| | a2 | 0 |
| | a3 | 0 |
| | a4 | 1 |

FIG. 3B

| REFERENCE VALUE STORING REGISTER | BIT | DATA |
|---|---|---|
| | b1 | 0 |
| | b2 | 0 |
| | b3 | 1 |
| | b4 | 1 |

FIG. 3C

| COMPARING DATA STORING REGISTER | BIT | DATA |
|---|---|---|
| | c1 | 0 |
| | c2 | 1 |
| | c3 | 1 |
| | c4 | 1 |

FIG. 3D

| BIT | DATA | BIT COINCIDENCE DETECTING RESULT | COMPARING DATA INVERSION RESULT | OR OPERATION RESULT | AND OPERATION RESULT |
|---|---|---|---|---|---|
| a1 | 1 | 0 | | 1 | 0 |
| b1 | 0 | | | | |
| c1 | 0 | | 1 | | |
| a2 | 0 | 1 | | 1 | |
| b2 | 0 | | | | |
| c2 | 1 | | 0 | | |
| a3 | 0 | 0 | | 0 | |
| b3 | 1 | | | | |
| c3 | 1 | | 0 | | |
| a4 | 1 | 1 | | 1 | |
| b4 | 1 | | | | |
| c4 | 1 | | 0 | | |

__US 7,046,184 B2__

ANALOG/DIGITAL CONVERTER FOR DETECTING COINCIDENCE OR NON-COINCIDENCE BETWEEN DATA AND A MICRO-COMPUTER INCLUDING THE ANALOG/DIGITAL CONVERTER

CROSS-REFERENCE TO RELATED APPLICATIONS

This application claims priority from, and the benefit of, Japanese Application No. 2003-387861, filed on Nov. 18, 2003, the contents of which are expressly incorporated herein by reference in their entirety.

BACKGROUND OF THE INVENTION

Field of the Invention

The present invention relates to an analog/digital converter for converting analog data acquired by measuring an object, and more particularly, to an analog/digital converter that may easily and accurately perform "coincidence detection" between A/D converted data and a reference value, and a micro-computer in which the analog/digital converter is installed.

An analog/digital converter (hereinafter simply referred to as an A/D converter) is widely used in many devices for monitoring various analog data, for example, for detecting battery voltage in a personal computer. Japanese Patent Application Publication 5-134807 discloses an exemplary configuration of such a conventional A/D converter. As apparent from FIG. 11 in the publication, a conventional A/D converter 200 includes an A/D converting unit 201 for converting analog data obtained by measuring an object to digital data, a memory circuit 202 for storing the converted digital data, and a data storing register 203 for storing comparing data. The conventional A/D converter 200 further includes a volume comparing circuit 204 for comparing a data volume of data stored in the memory circuit 202 with a data volume of data stored in the comparing data storing register 203, and an interrupt request signal generating circuit 205 for outputting an interrupt request signal in accordance with a comparison result of the data volume comparing circuit 204.

The comparison of data volumes between the memory data and the comparing data is executed at the A/D converting unit side in the conventional A/D converter 200. An interrupt request signal is generated and supplied to a CPU at a time only when a predetermined data volume is satisfied by the comparison of data volumes. To execute the direct data volume comparison between stored data and comparing data in the comparing circuit 204, the conventional A/D converter expects such a condition that the measured input analog voltages may gradually increase or reduce up to a predetermined voltage for performing an expected process in a micro-computer.

However, in actual cases, the conventional A/D converter 200 can not sufficiently perform so-called "coincidence detection" between the converted digital data and the comparing data, since input analog voltages may suddenly be greatly varied. Accordingly, it is impossible for the conventional A/D converter 200 to detect a critical moment or a time when the A/D converted data coincides with the comparing data. As explained later in FIG. 5, an A/D conversion in the conventional A/D converter may frequently skip over an accurate timing for the comparing data value, because it cannot detect a critical moment or a time when coincidence between converted data and comparing data occurs. Consequently, since the conventional A/D converter cannot generate an interrupt request signal to a CPU at a necessary time when input analog data coincide with comparing data, CPU can not perform an expected process at a proper timing. Thus, the conventional A/D converter and a micro-computer in which it is installed have many problems and defects for detecting coincidence between converted digital data and the comparing data.

FIG. 12 shows another configuration of the conventional A/D converter as disclosed in Japanese Patent Application Publication 2002-261609. As illustrated in FIG. 12, the conventional A/D converter 300 includes an A/D converting unit 301, a converted data storing register 302 for storing digital data converted in A/D converting unit 301, a comparing register 303 for storing a predetermined reference value for a base of operation in CPU 305 and a comparing circuit 304 for comparing digital data with the predetermined reference value. The A/D converter 300 generates an interrupt request signal to CPU 305 in accordance with a result of comparison in the comparing circuit 304.

Similar to the conventional A/D converter 200 explained in regard to FIG. 11, the conventional A/D converter 300 is also intended to directly compare data volumes in the comparing circuit 304. Thus, the comparing circuit 304 compares whether a data volume of the converted data is larger or smaller than a data volume of the predetermined value. Accordingly, both conventional A/D converters perform a direct data volume comparison between the converted data and the reference value by directly comparing all bits of the converted data with all bit of the reference value. Consequently, both of the conventional A/D converters disclosed in FIGS. 11 and 12 have the same problems and defects that they cannot detect a critical moment or a time when the converted data coincides with a reference value. Thus, it is impossible for the conventional A/D converter to easily perform coincidence detection at a critical moment. Accordingly, the conventional CPU cannot operate at a necessary timing.

SUMMARY OF THE INVENTION

An object of the present invention is to solve the above-mentioned problems and defects by providing an analog/digital converter that may easily perform a coincidence detection operation at a critical moment when coincidence occurs between A/D converted data and a reference value, and providing a micro-computer having the analog/digital converter installed therein.

Therefore, according to an embodiment of the present invention there is provided an analog/digital converter, including a CPU for executing operations; an analog/digital converting unit configured to convert into digital data analog data acquired by measuring an object; a converted data storing unit configured to store data converted in the analog/digital converting unit; a reference value storing unit configured to store a reference value serving as a base of operation of the CPU; a comparing data storing unit configured to store comparing data that indicate which bits of the converted data stored in the converted data storing unit are to be compared with which bits of the reference value stored in the reference value storing unit; a comparing unit configured to select comparison bits among the converted data and the reference value and to perform a comparison between the converted data and the reference value; and an interrupt request signal generating unit configured to generate an interrupt request signal to the CPU when the comparing unit detects coincidence.

The analog/digital converter consistent with the present invention may adjust a coincidence detection range by selecting comparing bits for a comparison between converted data and a reference value so as to compensate differences of timings at a moment when analog data reaches to a reference value and a time when the analog data is converted to digital data. Consequently, the present invention may provide an analog/digital converter that may easily perform coincidence detection operation between converted data and a reference value. Thus, the present invention may provide an analog/digital converter having a high reliability of coincidence detection by a relatively easy operation and a micro-computer in which the A/D converter of such a high reliability is installed.

BRIEF DESCRIPTION OF THE DRAWINGS

The accompanying drawings, which are incorporated in and constitute part of this specification, illustrate various embodiments and features of the invention, and together with the description, serve to explain the invention. Where possible, the same reference number will be used throughout the drawings to describe the same or like parts.

FIGS. 3A–3D are charts explaining logical operations of the comparing circuit 17 shown in FIG. 1.

DESCRIPTION OF THE EMBODIMENTS

Figure 1:
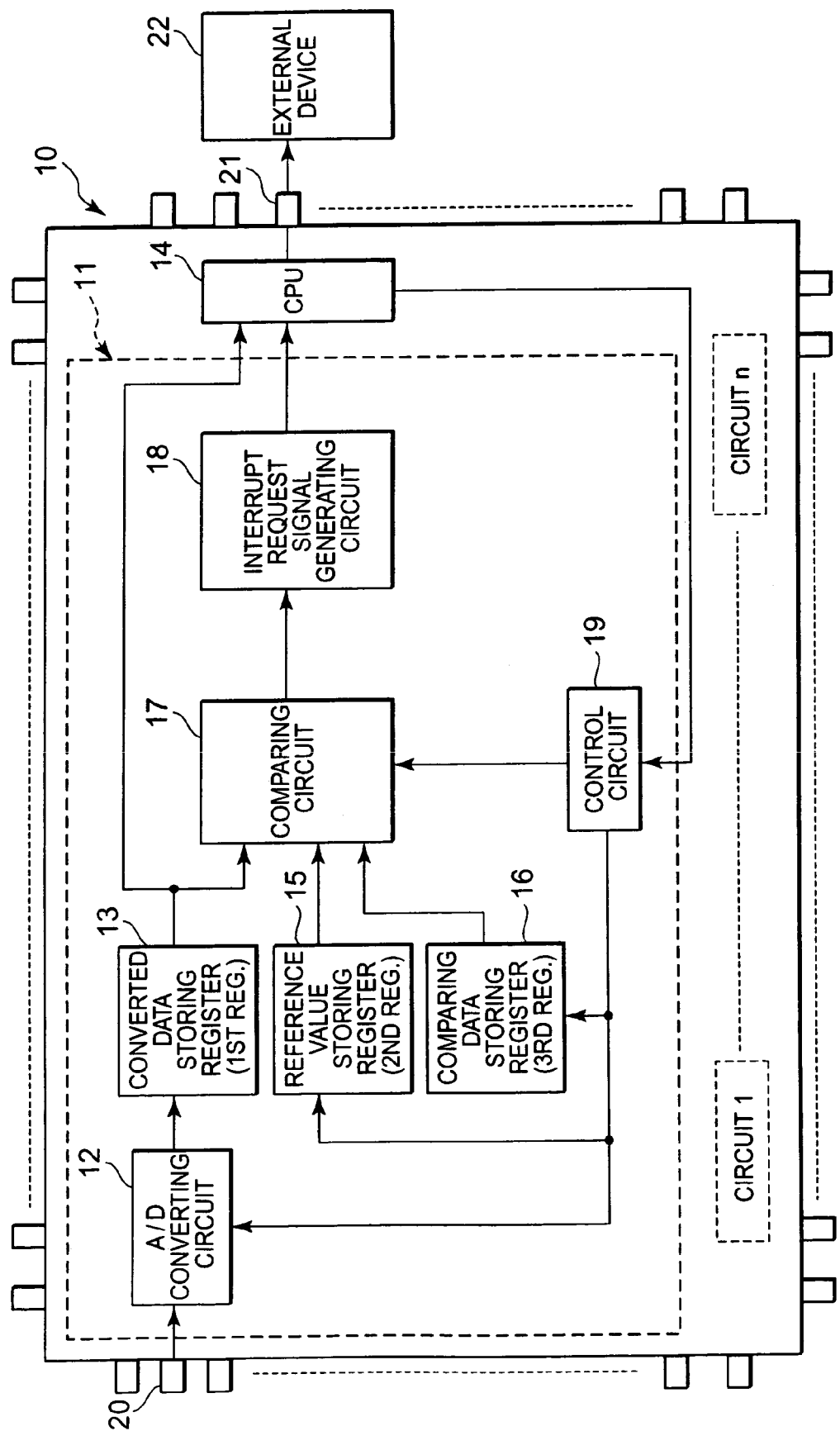
FIG. 1 is a block diagram illustrating configuration of a micro-computer in which an embodiment of A/D converter consistent with the present invention is installed.

Referring now to the drawings, FIG. 1 is an exemplary block diagram of a configuration of a micro-computer 10 including an A/D converter 11 consistent with an embodiment of the present invention. As illustrated in FIG. 1, A/D converter 11 includes an A/D converting circuit 12 configured to convert analog data that are acquired by measuring an object into digital data, a converted data storing register (hereinafter also referred to simply as a first register) 13 configured to store the converted data in the A/D converting circuit 12, and a reference value storing register (hereinafter also referred to simply as a second register) 15 configured to store a reference value for becoming a base for a predetermined operation in a CPU (central processing unit).

A/D converter 11, further includes a comparing data storing register (hereinafter also referred to simply as a third register) 16 configured to store comparing data that indicates which bit of the converted data being stored in the first register 13 may compare with which bit of the reference value being stored in the second register 15, and a control circuit 19 configured to select comparing bit among the converted data and the reference value in order to perform comparison between the converted data and the reference value. A/D converter 11 further includes a comparing circuit 17 configured to compare the converted data with the reference value based on the comparing signal from the third register 16, and an interrupt request signal generating circuit 18 configured to generate an interrupt request signal to the CPU in accordance with the coincidence detection signal from the comparing circuit 17. The operations of the A/D converting circuit 12, the second register 15 and the third register 16 and the comparing circuit 17 are controlled by a control circuit 19 in the A/D converter 11.

The micro-computer 10 includes a plurality of input terminals 20 configured to input analog data acquired by measuring objects to the A/D converting circuit 12 and a plurality of output terminals 21 configured to output result signals processed in the CPU 14 in order to provide the result signals from the micro-computer 10 to each of external devices 22. A/D converting circuit 12 converts analog data that are supplied through the plurality of input terminal 20 based on an instruction from the control circuit 19 to digital data. The converted digital data are stored in the first register 13. The first second register 15 stores a reference value of digital data that is intended to be used as an operation base for a process of the CPU 14.

The third register 16 stores comparing data that indicates which bit among the converted digital data in the first register 13 should be compared with which bit among the digital reference value data stored in the second register 15. Comparing circuit 17 performs a comparison between the converted digital data in the first register 13 and the digital reference value in the second register 15 based on comparing data instructed by the third register 16.

When the comparing circuit 17 detects "coincidence" as a result of the data comparison between the converted digital data and the digital reference value, it provides an instruction signal to the interrupt request signal generating circuit 18 so as to generate an interrupt request signal from the interrupt request signal generating circuit 18 to a CPU 14. CPU 14 is mounted on the same chip for the circuit configuration of the A/D converter 11. After processing a necessary operation based on the interrupt request signal, CPU 14 provides an instruction signal to an external device 22, such as, for example, an alarm device or a display device, through an microcomputer 10. Control circuit 19 controls a storing operation of the reference value stored in the second register 15 and also controls storing of comparing data into the third register 16 by receiving commands form CPU 14. Further, control circuit 19 provides a conversion start command to the A/D converting circuit 12. Control circuit 19 further provides a comparison command to the comparing circuit 17 so as to execute comparison between the digital converted data and the reference value.

Figure 2:
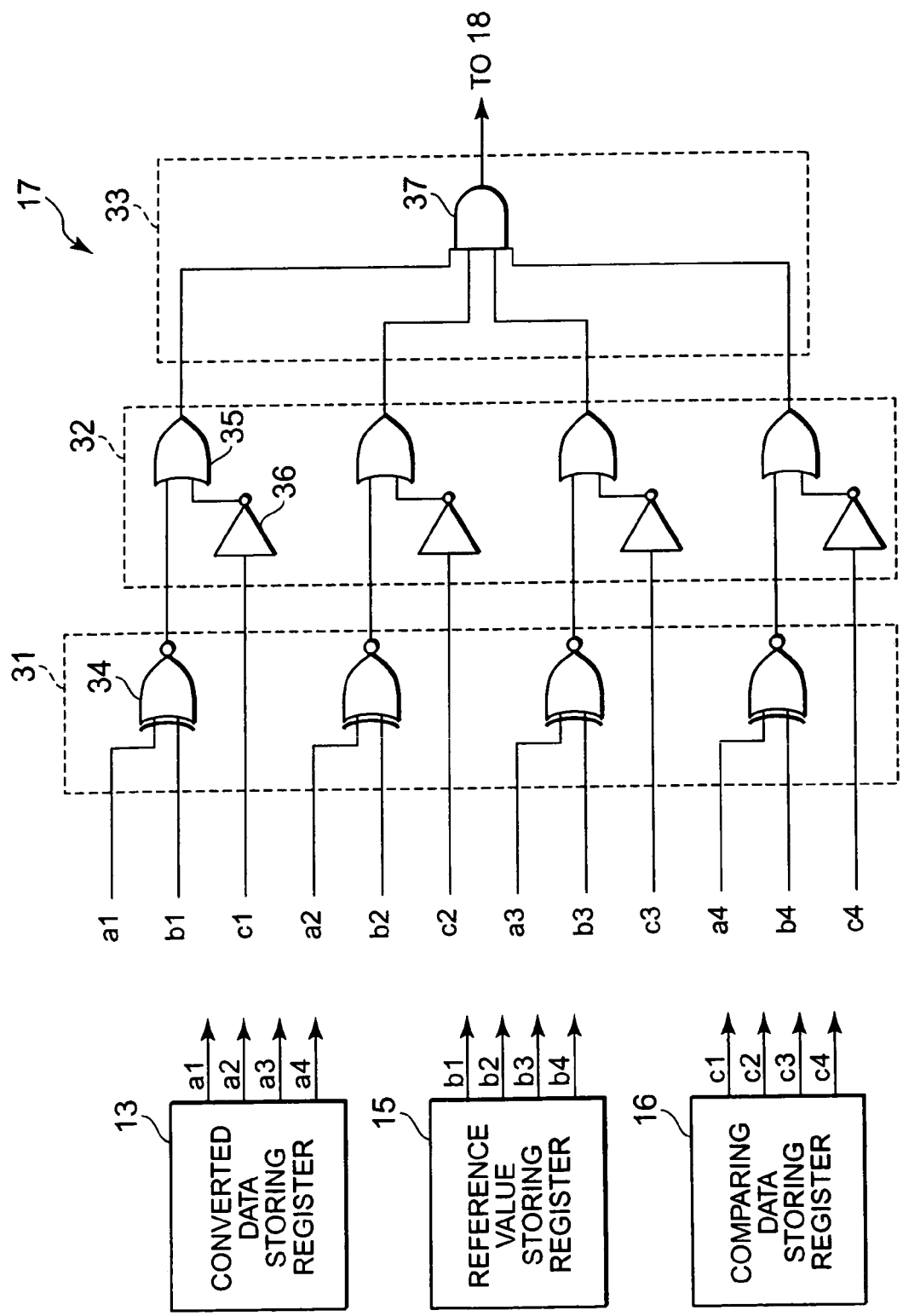
FIG. 2 is an exemplary circuit configuration of the comparing circuit 17 shown in FIG. 1.

FIG. 2 illustrates a practical circuit configuration of the comparing circuit 17. In this embodiment, it is supposed that A/D converter 11 consistent with the invention may convert, for example, 4 bits-construction data. Of course, it is possible to apply to 8 bits-construction data, for example. As illustrated in FIG. 2, comparing circuit 17 consistent with this embodiment includes a bit coincidence detecting unit 31, an OR operation unit 32 and an AND operation unit 33. Bit coincidence detecting unit 31 includes four XNOR (exclusive NOR) logic gate circuits 34 in order to detect coincidence of 4 bits-construction data. Thus, the number of XNOR logic gate circuits 34 is equal to the number of conversion bit of A/D converting circuit 12. In this embodiment, four XNOR (exclusive NOR) logic gate circuits 34 are included in the bit coincidence detecting unit 31. One input terminal of each XNOR logic gate circuit 34 is coupled to converted data storing register 13 and the other input terminal of each XNOR logic gate circuit 34 is coupled to reference value storing register 15. For example, one input terminal of 1st XNOR logic gate circuit 34 is coupled to a converted data a1 from the 1st storing register 13 and the other input terminal of 1st XNOR logic gate circuit 34 is coupled to a reference value b1 from the 2nd storing register 15. As apparent from FIG. 2, one input terminal of 2nd XNOR logic gate circuit 34 is coupled to a converted data a2 from the 1st storing register 13 and the other input terminal of 2nd XNOR logic gate circuit 34 is coupled to a reference value b2 from the 2nd storing register 15. Similarly, the 3rd XNOR logic gate circuit 34 inputs a converted data a3 from the 1st storing register 13 and a reference value b3 from the 2nd storing register 15. The 4th XNOR logic gate circuit 34 also inputs a converted data a4 from the 1st storing register 13 and a reference value b4 from the 2nd storing register 15.

OR operation unit 32 in the comparing circuit 17 includes a plurality of OR logic gate circuits 35 that equal in number to a conversion bit number of A/D converting circuit 12. Thus, the number of OR logic gate circuits 35 is four in this embodiment. One input terminal of each OR logic gate circuit 35 is coupled to an output terminal of each of four XNOR logic gate circuit 34. The other input terminal of each OR logic gate circuit 35 is coupled to comparing data storing register 16 for providing each comparing data through each of four inverters 36. Thus, as illustrated in FIG. 2, for example, a 1st OR logic gate circuit 35 inputs an output data from the 1 st XNOR logic gate circuit 34 and an inverted data of the 1st comparing data c1 supplied through a 1st inverter 36. AND operation unit 33 in the comparing circuit 17 includes an AND logic gate circuit 37 that has a plurality of input terminals equal in number to the number of conversion bits. Thus, in this embodiment, AND logic gate circuit 37 has four input terminals. Each input terminal of AND logic gate circuit 37 is connected to respective output terminals of four OR logic gate circuits 35.

The logic operation of comparing circuit 17 will be explained with reference to FIGS. 3A–3D. FIG. 3A shows converted data stored in converted data storing register 13. FIG. 3B shows reference values stored in reference value storing register 15. FIG. 3C shows comparing data stored in comparing data storing register 16. FIG. 3D explains results of logical operation of comparing circuit 17. As shown in FIGS. 2 and 3A–3D, suppose that converted data storing register 13 stores converted data of four bits "a4 a3 a2 a1", reference value storing register 15 stores reference value data of four bits "b4 b3 b2 b1" and comparing data storing register 16 stores comparing data of four bits "c4 c3 c2 c1" which is memorized in CPU 14. Each bit of a1, b1 and c1 in the respective data indicates the lowest positioned bit among the respective data, and each bit of a4, b4 and c4 indicates the highest positioned bit among the respective data.

As shown in FIG. 3A, converted data "a4 a3 a2 a1" is now supposed, for example, as "1001", FIG. 3B shows that reference value "b4 b3 b2 b1" stored in reference value storing register 15 is now "1100" and FIG. 3C shows that comparing data "c4 c3 c2 c1" stored in comparing data storing register 16 in this embodiment is, now, "1110". When a bit of comparing data indicates "1", it means that the position bit should be compared. If comparing data indicates "0", it indicates that this bit should not be compared. Thus, comparing data "1110" means that top side positioned three bits from the highest position bit c4 should be sequentially compared and the lowest positioned bit c1 should not be compared.

In accordance with the instruction of comparing data "1110", comparison operation between the converted data "1001" and the reference value "1100" is executed as shown in FIG. 3D. At first, each of four XNOR logic gate circuits 34 in the bit coincidence detecting unit 31 performs bit coincidence detection between converted data and reference value for all bits. In this example case, the lowest position bit a1 of the converted data is "1" and the lowest position bit b1 of the reference value is "0". Thus, the bit a1 of the converted data does not coincide with the b1 of the reference value. As a result, bit coincidence detecting operation obtains "0" as a detection result. A second lower positioned bit a2 of the converted data is "0" and a second lower positioned bit b2 of the reference value is "0". Since the second position bit a2 coincides with the second positioned bit b2, bit coincidence detection obtains a result "1". Similarly doing the coincidence detection against four input data, four XNOR logic gate circuits 34 obtained a result "1010" as bit coincidence detection.

Each of four OR logic gate circuits 35 in the OR operation unit 32 performs OR operation between the bit coincidence detection result "1010" of the bit coincidence detecting unit 31 and the comparing data inversion result "0001" that is acquired by inverting each bit of the comparing data "1110" though each of inverters 36. If bit "1" is included in either one of the comparing data inversion result or the bit coincidence detection result, a result of OR operation becomes "1". Accordingly, as shown in FIG. 3D, OR operation by the OR operation unit 32 obtains a result "1011". Finally, comparing circuit 17 performs AND operation against all bit of the result of OR operation result through OR logic gate circuits 35 by using AND logic gate circuit 37 of the AND operation unit 33. When all of four bits of the OR operation result indicates "1", i.e., "1111", AND operation becomes "1". However, if the OR operation result of includes "0" among the four bits, for example "1011", the AND operation result becomes "0".

In the above-described embodiment, the bit which is not compared is compulsorily set to be "1" in the OR operation result. Accordingly, it becomes possible to compare the converted data and the reference value data by the result of AND operation of all bits in spite of a bit coincidence detection result of the non-comparison bit. Accordingly, by comparing between the converted digital data and the reference value data based on the comparing data, the comparing circuit 17 can output a coincidence bit "1" when it detects "coincidence" between them, and if it detects "non-coincidence" between them, the comparing circuit 17 can output a non-coincidence bit "0". Thus, the comparing circuit 17 can simply judge whether or not the converted data coincides with the reference value based on the comparing data. Consistent with the invention, different from the conventional art, it need not judge the data volume relationship. Accordingly, it becomes possible to simply construct the comparing circuit.

Figure 4:
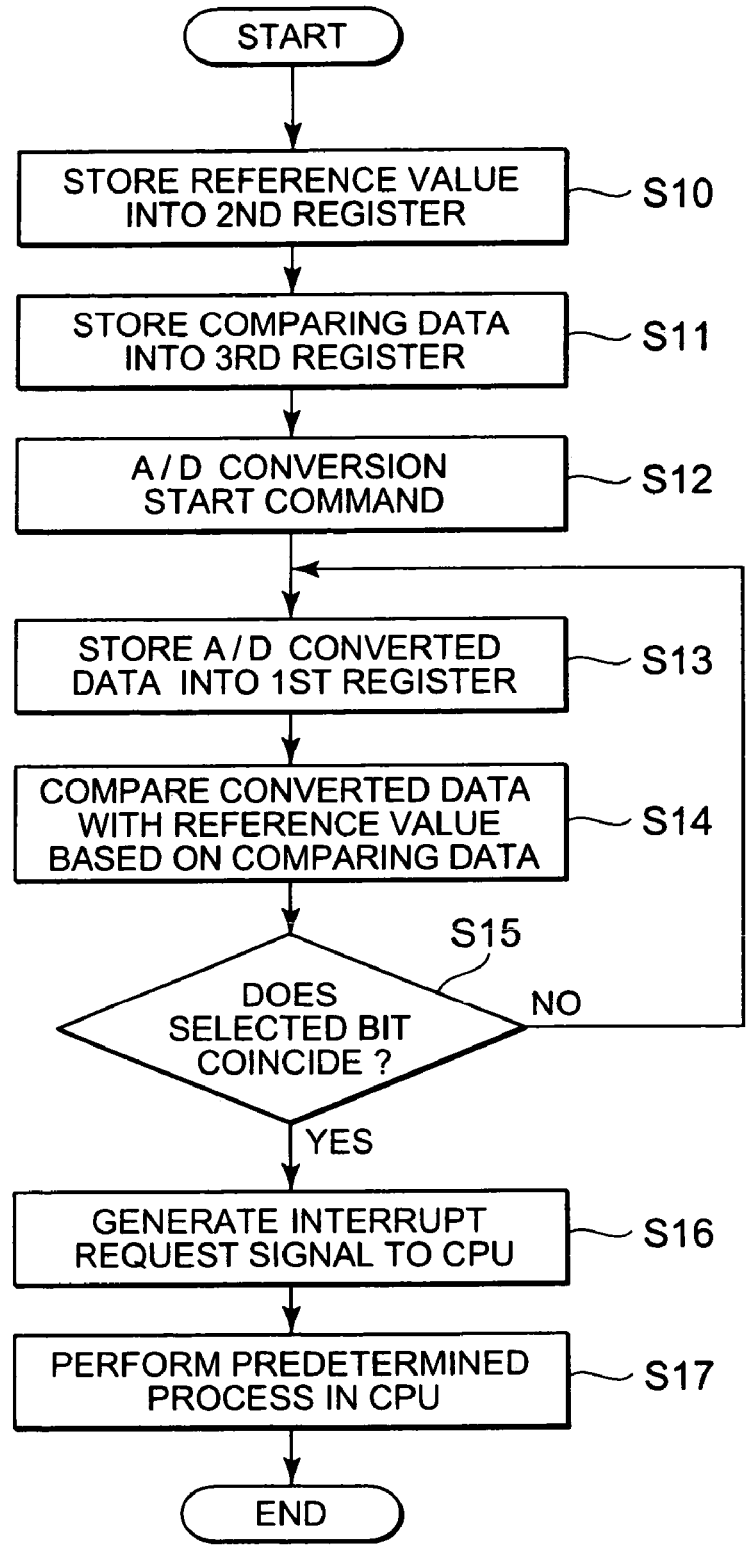
FIG. 4 is a flowchart explaining a control process of the micro-computer 10 illustrated in FIG. 1.

FIG. 4 is a flowchart for explaining operation of A/D converter 11. Initially, a reference value is stored in reference value storing register (2nd register) 15 (step S10) as a processing basis for CPU 14. To instruct which bit of converted data is compared with which bit of reference value, comparing data is stored in comparing data storing register 16 (step S11). Then, control circuit 19 provides A/D conversion start command to A/D converting circuit 12 (step S12). Then, A/D converting circuit 12 converts analog data that is acquired from measuring objects by reading through input terminal 20 at a predetermined interval to digital data. Converted digital data is stored into converted data storing register 13 (step S13).

Whenever A/D converting circuit 12 completes A/D conversion, comparing circuit 17 reads converted data, reference value and comparing data based on comparing data, and performs comparison between converted data and the reference value (step S14). If a result of comparison indicates "coincidence" (step S15, Yes), interrupt request signal generating circuit 18 generates an interrupt request signal to CPU 14 (step S16). Then, CPU 14 executes a predetermined interrupt process (step S17). On the other hand, if a result of comparison indicates "non-coincidence" (step S15, No), the process returns to step S13 for executing steps S13–S15 at a predetermined interval until the comparison result indicates "coincidence."

Figure 5:
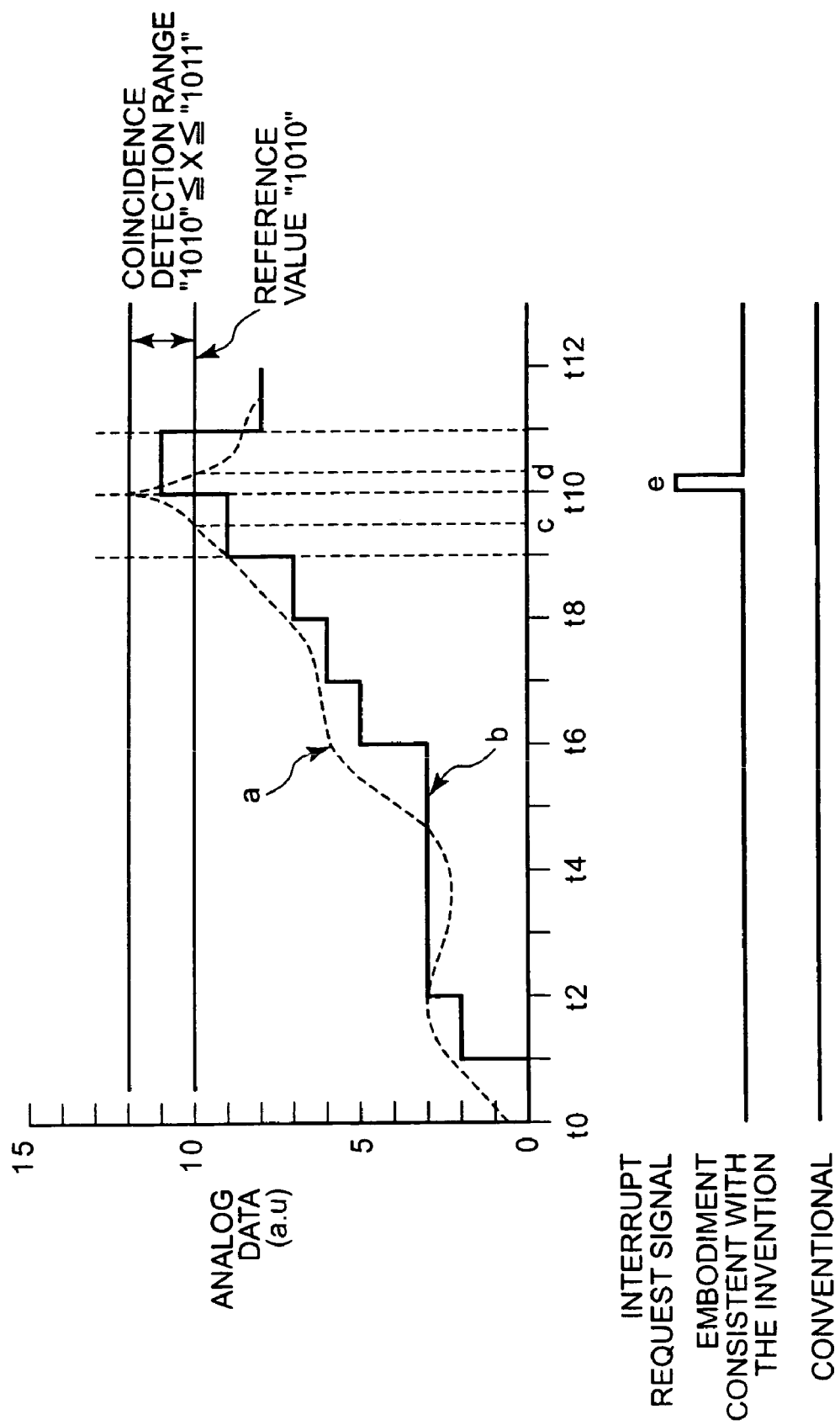
FIG. 5 is a timing chart explaining a coincidence detection operation being performed by the A/D converter 17 shown in FIG. 1.

FIG. 5 is a timing chart for explaining an exemplary case of generation of an interrupt request signal to CPU 14 at a critical moment when a coincidence between converted data and reference value based on comparing data occurs. As an examplary case that a measuring process is required at a time when converted data coincide with a reference value, a case for issuing alarm by judging a time when a temperature or a pressure reaches to a limit value in a home-use equipment is supposed. As shown in FIG. 5, A/D converting circuit converts analog data (a) to digital data (b) at a predetermined interval. At a moment (c) between time t9 and time t10, analog data (a) has actually reached to a reference value "1010". However, converted data still keeps "1001", since a conversion time of A/D converting circuit shifts from the moment (c). Analog data (a) again coincides with reference value "1010" at a moment (d) between times t10 and t11 by passing over reference value. However, converted data at this moment becomes "1011" since conversion time of A/D converting circuit is again shifted form the moment of occurrence of coincidence.

According to this embodiment, upper-side positioned 3 bits are compared sequentially from the highest position bit based on the comparing data "1110". Consequently, it becomes possible to detect coincidence between the upper positioned 3 bits "101" of reference value and the upper positioned 3 bits "1101" of converted data at a time t10. Consequently, an interrupt request signal (e) can be generated at the time t10. Thus, CPU 14 can perform a necessary process without missing a necessary timing. On the contrary, in the conventional art, it impossible to obtain converted data that coincide with reference value "1010" between t9–t11. Accordingly, CPU in the conventional art cannot perform a necessary process at a necessary timing, since an interrupt request signal is not generated at the necessary moment.

As explained, A/D converter 11 consistent with this embodiment of the invention performs coincidence detection by comparing between converted data and reference value based on comparing data. Accordingly, it becomes possible to accurately detect a coincidence time between analog data and a reference value. Consequently, a CPU may execute a necessary process without missing a proper timing. Thus, the present invention can provide an A/D converter of a simple comparing operation and a high reliability and a micro-computer in which the A/D converter is installed thereof.

In this embodiment, the converter is adopted that bit "1" of comparing data means comparison and bit "0" means non-comparison. Of course, it is possible to change the meaning that bit "1" of comparing data means non-comparison and bit "0" means comparison. By so defining, inverters 35 of OR operation unit 32 can be omitted. Accordingly, it becomes possible to simply the circuit configuration of comparing circuit 17. Further, it also is possible to increase the conversion bit number of A/D converter. For example, of course it is possible to construct an 8 bit or higher A/D converter.

Figure 6:
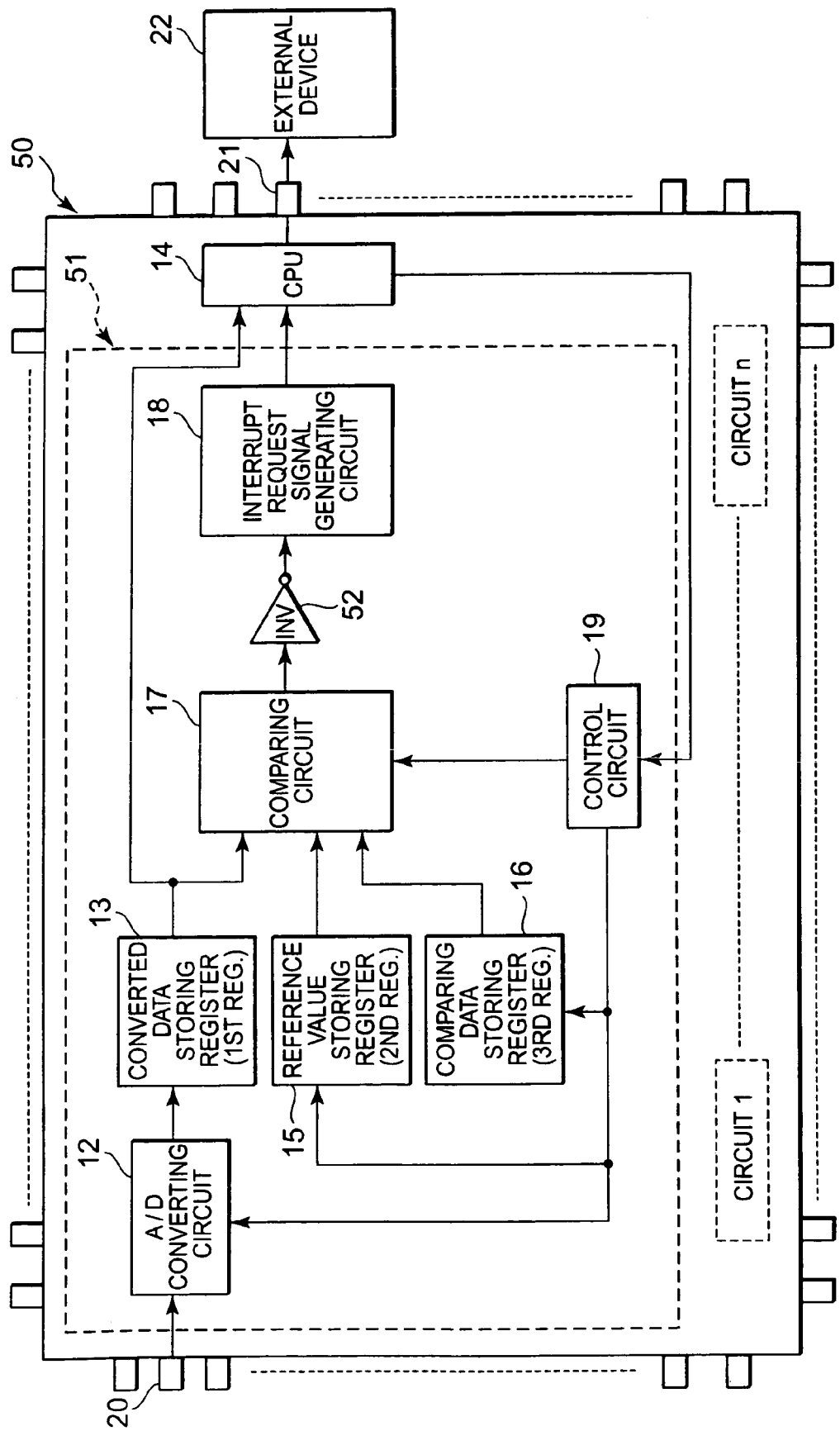
FIG. 6 a block diagram illustrating configuration of a micro-computer 50 in which an A/D converter 51 of another embodiment consistent with the present invention is installed.

FIG. 6 illustrates a configuration of a micro computer including an A/D converter according to another embodiment of the invention. To simplify the explanation, like parts of the two embodiments have the same reference numeral designations and description thereof are omitted. The embodiment of FIG. 6, unlike the first embodiment in FIG. 1, detects a moment when converted data does not coincide with a reference value based on comparing data. That feature is achieved by providing a compared result signal inversion circuit for inverting compared result signal from comparing circuit 17. As illustrated in FIG. 6, A/D converter 51 installed in a micro computer 50 consistent with this embodiment includes a compared result signal inversion circuit (INV) 52 provided between a comparing circuit 17 and an interrupt request signal generating circuit 18. Compared result signal inversion circuit 52 is, for example, an inverter for inverting compared result signal from comparing circuit 17. The inverter 17 outputs compared result inverted signal to interrupt request signal generating circuit 18.

Figure 7:
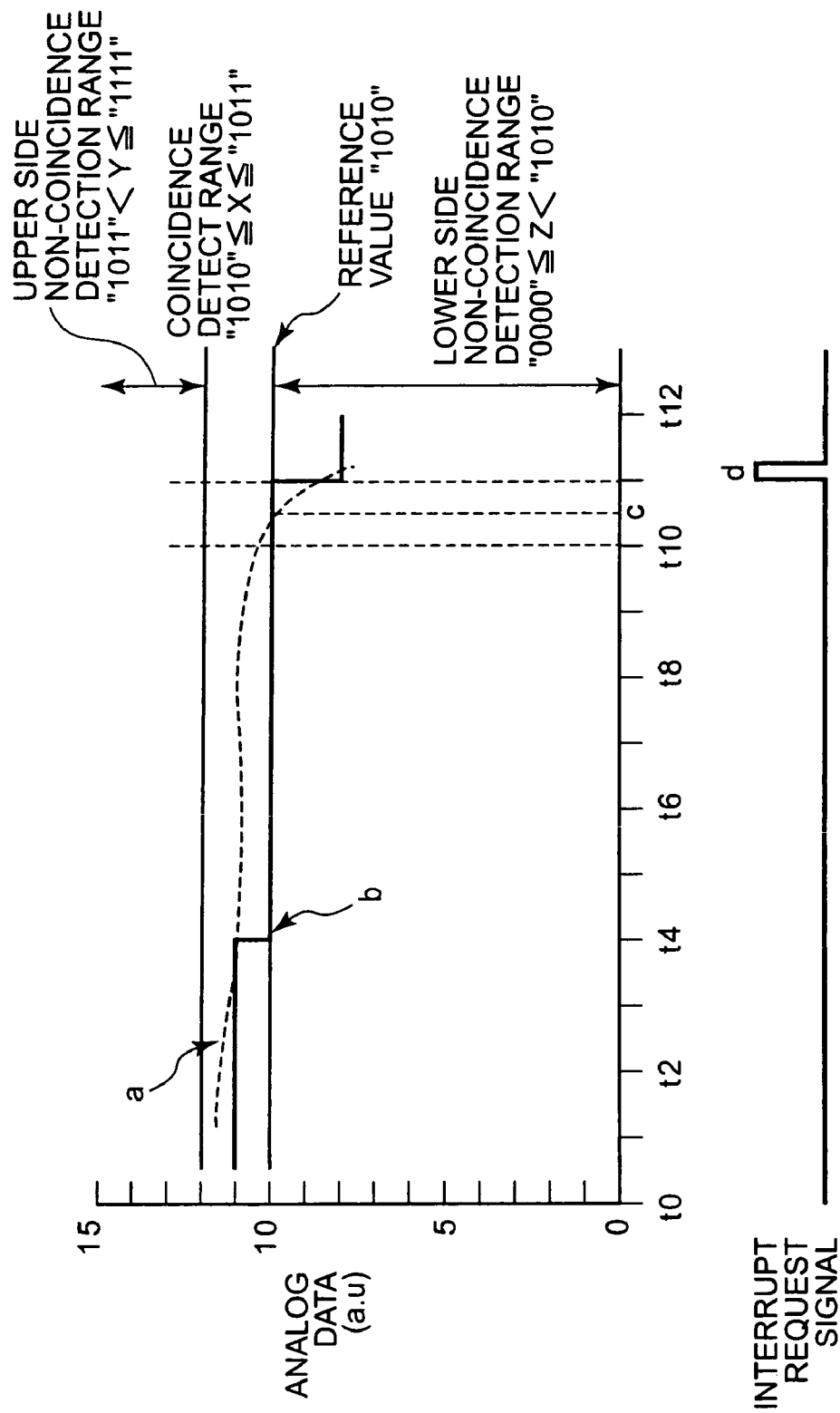
FIG. 7 is a timing chart for explaining non-coincidence detection operation being performed by the A/D converter 51 shown in FIG. 6.

FIG. 7 is a timing chart explaining a case of generating an interrupt request signal to CPU14 at a moment when non-coincidence is detected between converted data and a reference value by comparing them based on comparing data. Such a non-coincidence is used for detecting a moment when an analog data deviates from a predetermined range, such as a shortage time of battery voltage for a personal computer is detected and immediately executing data storing into a memory. As illustrated in FIG. 7, A/D converting circuit 12 converts analog data (a) into digital data (b) at a predetermined interval. Analog data (a) locates within the coincidence detecting range X of the reference value "1010" during times t0 to t10.

Analog data (a) deviates from coincidence detecting range X of the reference value during times t10 to t11. However, it differs from a conversion timing for A/D converting circuit 12. Thus, its converted data "1010" locates in the coincidence detecting range X for the reference value. At a time t11, its converted data becomes "1000" and it locates in a lower side non-coincidence detecting range Z by deviating a coincidence detecting range X for a reference value "1010". As apparent from FIG. 7, in this embodiment, upper positioned 3 bits are sequentially compared from the highest position bit based on comparing data "1110". Accordingly, "non-coincidence" between the upper positioned 3 bits "101" of the reference value and the upper positioned 3 bits "100" of the converted data is detected at a time t11.

As a result, since the compared result signal changes from bit "1" to bit "0," compared result inversion signal that is inverted changes from bit "0" to bit "1," it becomes possible to transfer "non-coincidence" to interrupt request signal generating circuit 18. Since an interrupt request signal (d) is generated at a time t11, CPU 14 may perform a necessary process without missing a necessary time. Thus, A/D converter 51 consistent with the second embodiment performs "non-coincidence" detection by inverting compared result that is acquired by comparing converted data with reference value based on comparing data. Accordingly, even when analog data deviates either from an upper side or a lower side of the coincidence detecting range, the present invention may detect "non-coincidence" between them by only one comparison. Consequently, it becomes possible for the CPU to execute necessary processes without missing a critical timing.

Accordingly, it becomes possible to provide a micro-computer installed A/D converter of a simple comparing operation and a high reliability. In this embodiment, a case has been explained in which analog data (a) is located in a lower side non-coincidence detecting range Z with deviation from the coincidence detecting range X. Of course, it is possible for a case when analog data (a) is located in an upper side non-coincidence detecting range Y. In either case, it becomes possible to detect "non-coincidence" by only once comparison.

Figure 8:
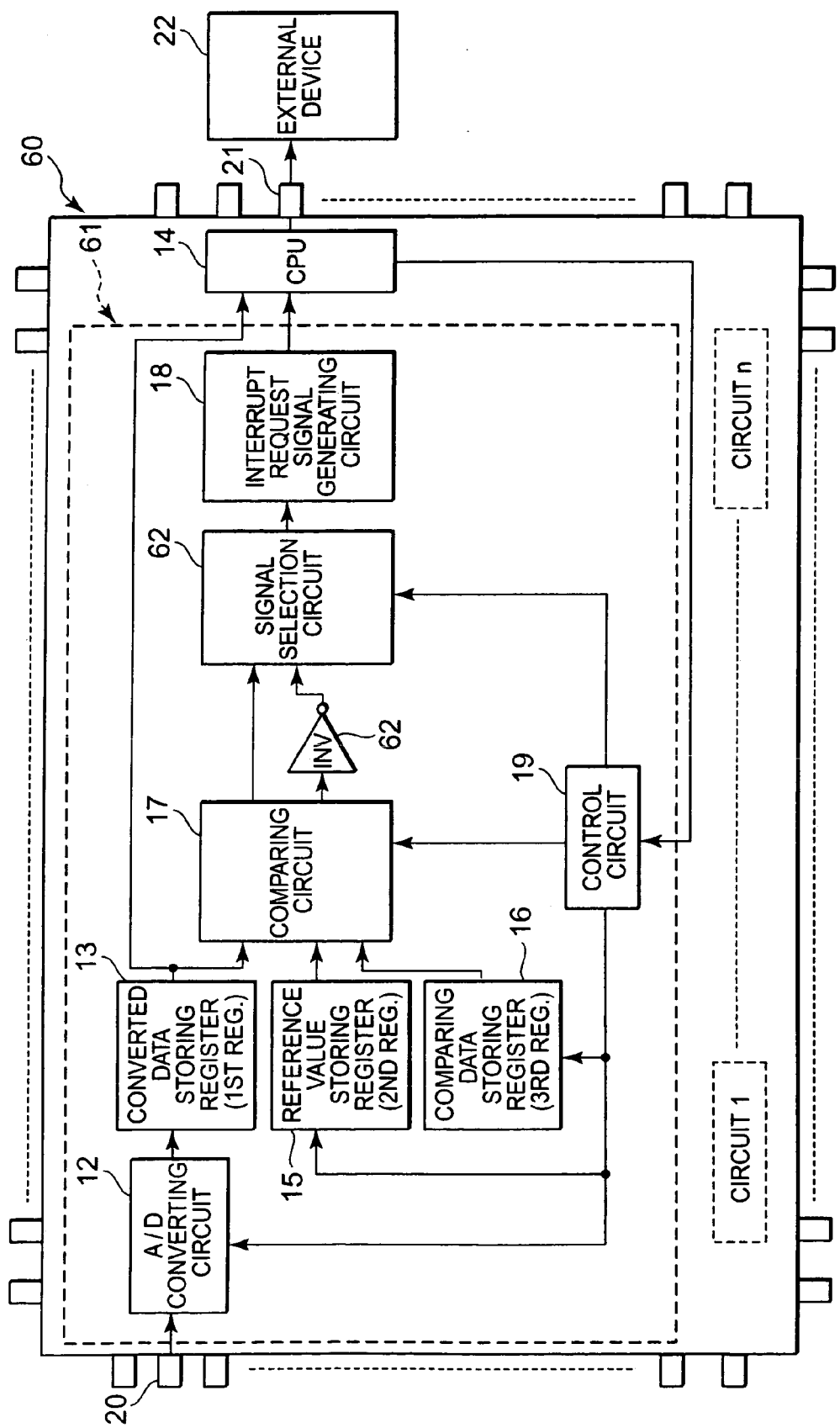
FIG. 8 is a block diagram illustrating a configuration of a micro-computer 60 in which an A/D converter 61 of further an embodiment consistent with the present invention is installed.

FIG. 8 is a block diagram illustrating a configuration of micro-computer including an A/D converter consistent with a third embodiment of the invention. To simplify explanation, description of the same parts as illustrated in the configuration of the first embodiment in FIG. 1 are omitted by simply affixing the same reference numbers to FIG. 1. Here, different parts only are explained. According to this embodiment, since a compared result signal inversion circuit for inverting compared result signal from the comparing circuit 17 and a signal selection circuit are provided, it becomes possible to select a moment when converted data coincides with the reference value based on comparing data or a moment when non-coincidence appears between them.

As illustrated in FIG. 8, A/D converter 61 installed in micro-computer 60 consistent with the invention includes signal selection circuit 62 provided between compared signal inversion circuit 52 and interrupt request signal generating circuit 18. Signal selection circuit 62 is configured by a switching circuit, such as an MOS transistor. Signal selection circuit 62 selects either one of compared result signal or compared result inversion signal by a command from control circuit 19 and provides the selected signal to interrupt request signal generating circuit 18.

Figure 9:
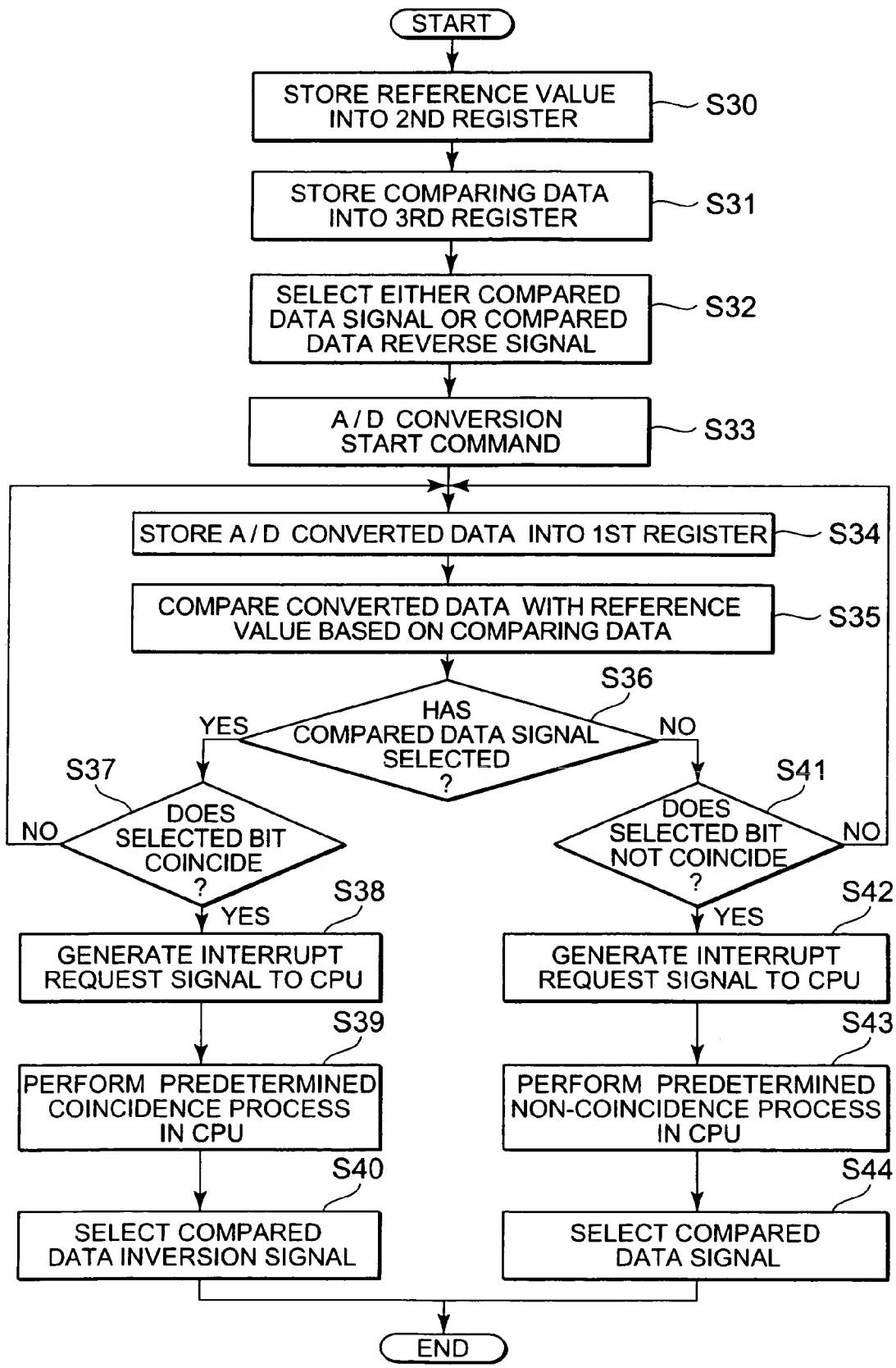
FIG. 9 is a flowchart for explaining a control process of the micro-computer 60 depicted in FIG. 8.

FIG. 9 is a flowchart for explaining operation of A/D converter 61 shown in FIG. 8. As an initial setting, a reference value as a process standard for CPU 14 is stored into reference value storing register ($2^{nd}$ register) 15 (step S30). A comparing data is stored into a comparing data storing register ($3^{rd}$ register) 16 for indicating which bits of converted data may be compared with which bits of the reference value (step S31). To provide an interrupt request to CPU 14, either one of a compared result signal from comparing circuit 17 or an inverted signal of the compared result signal from compared result signal inversion circuit 52 is selected and is instructed to signal selection circuit 62 through control circuit 19 (step S32).

Control circuit 19 provides an A/D conversion start command to A/D converting circuit 12 (step S33). Then, A/D converting circuit 12 stores converted digital data into converted data storing register ($1^{st}$ register) 13 by converting acquired analog data from measuring objects by reading at a predetermined interval through input terminals 20. At each completion of A/D conversion, comparing circuit 17 compares converted data with reference value based on comparing data by reading converted data, reference value and comparing data (step S35). When a comparing result signal is selected (step S36, YES), the compared result is judged (step S37). When the compared result indicates "coincidence" (step S37, YES), interrupt request signal generating circuit 18 generates an interrupt request signal to CPU 14 (step S38). CPU 14 executes a predetermined "coincidence" interrupt process (step S39).

Next, control circuit 19 sends a selection instruction to signal selection circuit 62 so as that an interrupt request to CPU 14 may be instructed by the compared result inversion signal (step S40). When the compared result indicates "non-coincidence" (step S37, NO), A/D converter 61 goes back to step S34, and repeats steps S34 to S37 at a predetermined interval until the compared result indicates "coincidence." At step S36, if the compared result signal is selected (step S36, NO), the compared result is judged (step S41). If the compared result indicates "non-coincidence" (step S41, YES), interrupt request signal generating circuit 18 generates an interrupt request signal to CPU 14 (step S42), and CPU14 executes a predetermined interrupt process for "non-coincidence" (step S43).

Next, control circuit 19 sends a selection instruction to signal selection circuit 62 so that an interrupt request to CPU 14 may be instructed by the compared result signal (step S44). If the compared result indicates "coincidence" (step S41, NO), A/D converter 61 goes back to step S34, and repeats steps S34 to S36 and step S41 at a predetermined interval until the compared result indicates "coincidence."

Figure 10:
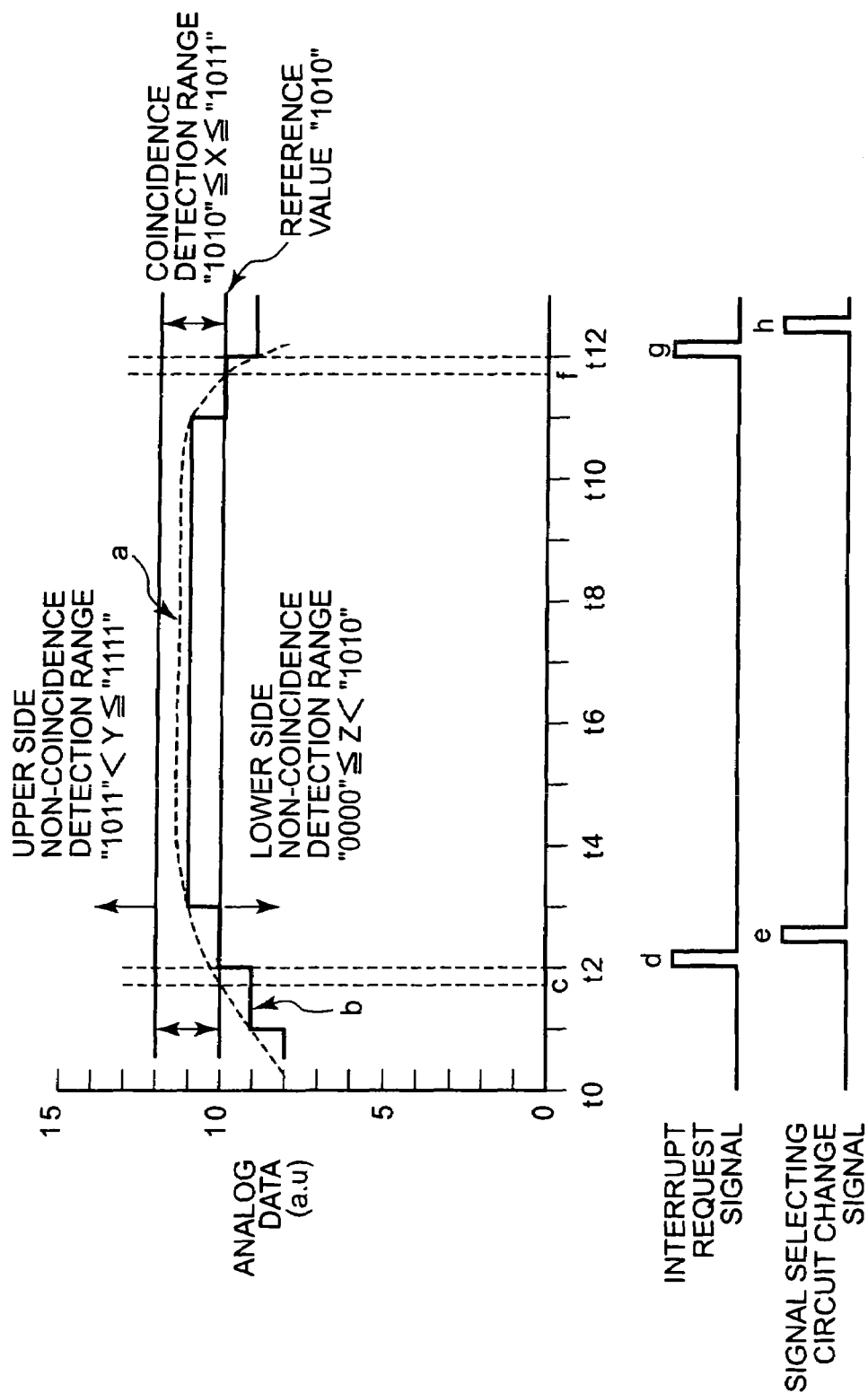
FIG. 10 a timing chart for explaining non-coincidence detection operation by the A/D converter 60 depicted in FIG. 8.
Figure 11:
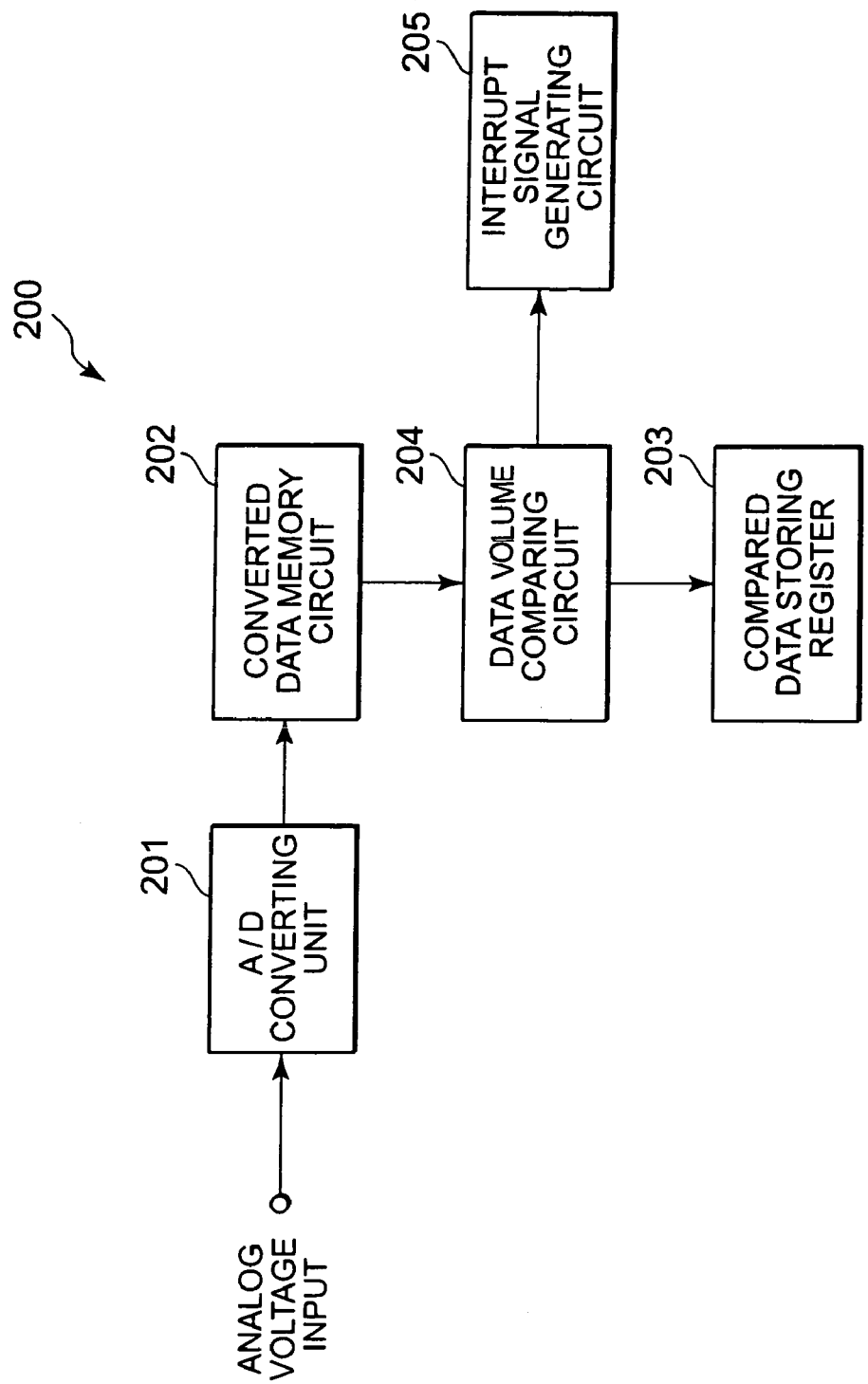
FIG. 11 is a block diagram illustrating a configuration of a conventional A/D converter.
Figure 12:
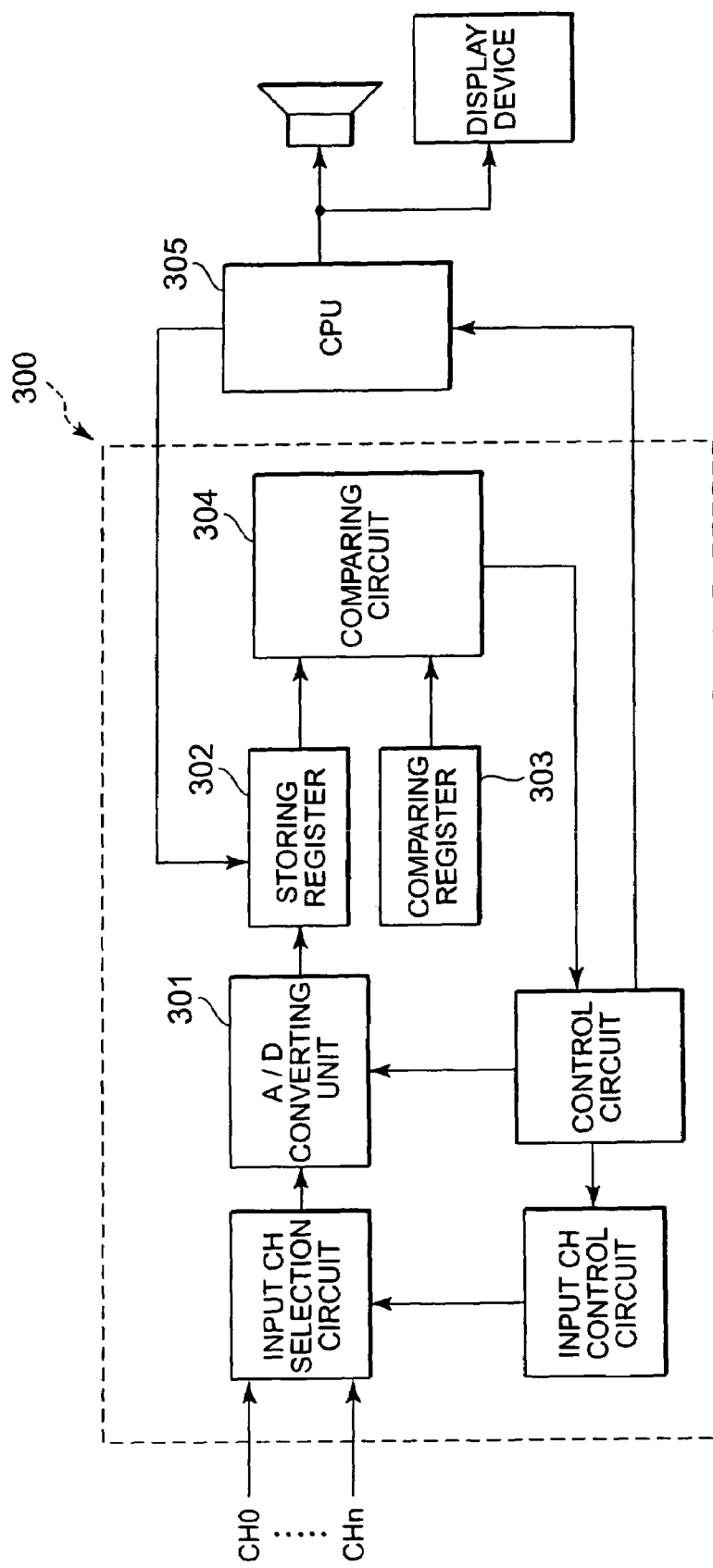
FIG. 12 is a block diagram illustrating a configuration of another conventional A/D converter.

FIG. 10 is a timing chart illustrating generation of an interrupt request signal to a CPU 14 at each time when a coincidence and a non-coincidence is respectively detected as a compared result after comparing between converted data and a reference value based on indicated comparing data. Such an instant process operation by acquiring a critical moment from when analog data reaches to a predetermined range and to when analog data deviates from the predetermined range is needed in such a case, for example, for examining a battery life for a personal computer by monitoring a time from when a fill charge of the battery has completed and when a shortage of battery charge appears.

As illustrated in FIG. 10, A/D converting circuit 12 converts analog data (a) to a digital data (b) during a predetermined interval. Firstly, a "coincidence" detection is performed. Analog data (a) coincides with a reference value "1010" at a time (c) between times t1 and t2, the digital data (b) coincides with a coincidence detecting range X of the reference value "1010" at a time t2. Since an interrupt request signal (d) is generated at a time t2, CPU 14 executes a predetermined "coincidence" process and provides an instruction signal (e) to a signal selection circuit 62 so as to change a compared result signal to a compared result inversion signal.

Next, a non-coincidence detection is performed after the time t2. Analog data (a) enters a coincidence detecting range X during a period from a time t2 to a time t11. Analog data (a) coincides with the reference value "1010" at a time f between times t11 and t12, and it deviates from the coincidence detecting range X to a lower side non-coincidence detecting range Z. By generating an interrupt request signal (g) at a time t12, CPU 14 performs a predetermined "non-coincidence" process and provides an instruction signal (h)

to a signal selection circuit 62 so as to change a compared result inversion signal to a compared result signal.

As apparent from FIG. 10, in this embodiment, the three upper positioned bits are compared sequentially from the highest position bit based on comparing data "1110". Accordingly, "coincidence" between the upper positioned 3 bits "101" of reference value and the upper positioned 3 bits "101" of the converted data is detected at a time t2. Consequently, since the compared result signal changes from "0" to "1", a compared result inversion signal is selected by generating an interrupt request signal. Next, "non-coincidence" between the three upper positioned bits "100" of the reference value and the three upper positioned bits "001" of the converted data is detected at a time t12. Consequently, since the compared result signal changes from "0" to "1," a compared result inversion signal is selected by generating an interrupt request signal.

As explained above, in A/D converter 61 consistent with third embodiment, signal selection circuit 62 can select "coincidence detection" or "non-coincidence detection." Accordingly, it becomes possible to detect a full range from when analog data enters into a coincidence detecting range to when it deviates from the coincidence detecting range. Consequently, it becomes possible for the CPU to execute necessary processes. For example, the CPU can execute necessary processes without missing "coincidence" timing or a "non-coincidence" timing of analog data. Thus, the present invention can provide a micro-computer installed with such an A/D converter that can easily perform comparing operation with a high reliability.

To compare selected bits, three upper positioned bits are sequentially selected in the above explained embodiment. Of course, it is possible to perform the comparison by variously changing or varying conditions. For example, it becomes possible to expand a coincidence detecting range by sequentially selecting two upper positioned bits from the highest position bit in order to execute bit comparison operation.

Other embodiments of the invention will be apparent to those skilled in the art from consideration of the specification and practice of the invention disclosed herein. It is intended that specification and examples be considered as exemplary only, with a true scope and spirit of the invention being indicated by the following claims.

What is claimed is:

1. An analog/digital converter comprising:
  an analog/digital converting unit configured to convert analog measurement into digital data including converted data bits;
  a converted data storing unit configured to store the data converted in the analog/digital converting unit;
  a reference value storing unit configured to store reference value data for a process of a CPU, the reference value data including reference data bits;
  a comparing data storing unit configured to store comparing data that indicates which of the converted data bits of the converted data stored in the converted data storing unit are to be compared with which of the reference data bits of the reference value stored in the reference value storing unit;
  a comparing unit configured to select comparison bits among the converted data bits and the reference data bits and to perform a comparison between the converted data and the reference value data; and
  an interrupt request signal generating unit configured to generate an interrupt request signal to the CPU when the comparing unit detects coincidence between the converted data bits and the reference data bits.

2. An analog/digital converter comprising:
  an analog/digital converting unit configured to convert measurement analog data to digital data including converted data bits;
  a converted result storing unit configured to store a converted result produced by the analog/digital converting unit;
  a reference value storing unit configured to store a reference digital value for executing a predetermined process in a CPU, the reference digital value including reference data bits;
  a comparing data storing unit configured to store comparing data that indicates which of the converted data bits of the converted result and which bits of the reference digital value are to be compared;
  a comparing unit configured to compare the converted result with the reference digital value by comparing bits of the converted result with bits of the reference digital value based on the comparing data;
  a compared result signal inversion unit configured to invert a compared result signal provided from the comparing unit; and
  an interrupt request signal generating unit configured to generate an interrupt request signal applied to the CPU, wherein the interrupt request signal generating unit generates the interrupt request signal applied to the CPU at a moment when a compared result of the comparing unit detects "non-coincidence" between the converted data bits and the reference data bits.

3. An analog/digital converter, comprising:
  an analog/digital converting unit configured to convert analog measurement to digital data including converted data bits;
  a converted result storing unit configured to store a converted result produced by the analog/digital converting unit;
  a reference value storing unit configured to store a reference digital value for executing a predetermined process in a CPU, the reference digital value including reference data bits;
  a comparing data storing unit configured to store comparing data that indicates which bits of the converted result and which bits of the reference digital value are to be compared;
  a comparing unit configured to compare the converted result with the reference digital value based on bits selected for comparison by the comparing data;
  a compared result signal inversion unit configured to invert a compared result signal provided from the comparing unit;
  a signal selection circuit configured to select either the compared result signal or the compared result inverted signal; and
  an interrupt request signal generating unit configured to generate an interrupt request signal to the CPU, wherein the interrupt request signal generating unit generates the interrupt request signal at a time when the compared result by the comparing unit judges either "coincidence" or "non-coincidence" between the converted data bits and the reference data bits.

4. The analog/digital converter according to any one of claims 1 to 3, wherein the comparing unit selects a predetermined upper positioned bit sequentially from the highest position bit but excepting the lowest position bit in order to define a coincidence detection range and compares converted result data and the reference value based on the selected bit of comparing data; and the interrupt request signal generating unit generates the interrupt request signal applied to the CPU when the comparing unit detects the converted result data in the coincidence detection range.

5. The analog/digital converter according to any one of claims 1 to 3, wherein the comparing unit comprises:
a judging circuit configured to judge whether the converted data and the reference value coincide with each other bit by bit;
an OR operation circuit configured to perform an OR operation for a judged result of the judging circuit and the compared data bit by bit; and
an AND operation circuit configured to perform an AND operation on all bits of the OR operation circuit.

6. The analog/digital converter according to claim 5, wherein:
the judging circuit comprises an XNOR logic gate;
the OR circuit comprises OR logic gates; and
the AND circuit comprises an AND logic gate.

7. A micro-computer comprising:
a CPU; and
an analog/digital converter comprising
an analog/digital converting unit configured to convert analog measurement data into digital data including converted data bits,
a converted data storing unit configured to store the data converted in the analog/digital converting unit,
a reference value storing unit configured to store reference value data for a process base of the CPU, the reference value data including reference data bits,
a comparing data storing unit configured to store comparing data that indicates which of the converted data bits of the converted data stored in the converted data storing unit are to be compared with which of the reference data bits of the reference value stored in the reference value storing unit,
a comparing unit configured to select comparison bits among the converted data bits and the reference data bits and to perform a comparison between the converted data and the reference value data, and
an interrupt request signal generating unit configured to generate an interrupt request signal to the CPU when the comparing unit detects coincidence between the converted data bits and the reference data bits.

8. A micro-computer comprising:
a CPU; and
an analog/digital converter comprising
an analog/digital converting unit configured to convert measurement analog data to digital data including converted data bits,
a converted result storing unit configured to store a converted result produced by the analog/digital converting unit,
a reference value storing unit configured to store a reference digital value for executing a predetermined process in a CPU, the reference digital value including reference data bits,
a comparing data storing unit configured to store comparing data that indicates which bits of the converted result and which bits of the reference digital value are to be compared,
a comparing unit configured to compare the converted result with the reference digital value by comparing bits of the converted result with bits of the reference digital value based on the comparing data,
a compared result signal inversion unit configured to invert a compared result signal provided from the comparing unit, and
an interrupt request signal generating unit configured to generate an interrupt request signal applied to the CPU,
wherein the interrupt request signal generating unit generates the interrupt request signal applied to the CPU at a moment when a compared result of the comparing unit detects "non-coincidence" between the converted data bits and the reference data bits.

9. A micro-computer comprising:
a CPU; and
an analog/digital converter comprising
an analog/digital converting unit configured to convert analog measurement to digital data including converted data bits,
a converted result storing unit configured to store a converted result produced by the analog/digital converting unit,
a reference value storing unit configured to store a reference digital value for executing a predetermined process in a CPU, the reference digital value including reference data bits,
a comparing data storing unit configured to store comparing data that indicates which bits of the converted result and which bits of the reference digital value are to be compared,
a comparing unit configured to compare the converted result with the reference digital value based on bits selected for comparison by the comparing data,
a compared result signal inversion unit configured to invert a compared result signal provided from the comparing unit,
a signal selection circuit configured to select either the compared result signal or the compared result inverted signal, and
an interrupt request signal generating unit configured to generate an interrupt request signal to the CPU,
wherein the interrupt request signal generating unit generates the interrupt request signal at a time when the compared result by the comparing unit judges either "coincidence" or "non-coincidence" between the data converted data bits and the reference data bits.

10. The micro-computer according to any one of claims 7–9, wherein the comparing unit of the analog/digital converter selects a predetermined upper positioned bit sequentially from the highest position bit but excepting the lowest position bit in order to define a coincidence detection range and compares converted result data and the reference value based on the selected bit of comparing data; and the interrupt request signal generating unit generates the interrupt request signal to the CPU when the comparing unit detects the converted result data in the coincidence detection range.

11. The analog/digital converter according to any one of claims 1 to 3, wherein the comparing unit comprises:
a judging circuit configured to judge whether the converted data and the reference value coincide with each other bit by bit;
an OR operation circuit configured to perform an OR operation for a judged result of the judging circuit are by bit and the compared data; and
an AND operation circuit configured to perform an AND operation on all bits of the OR operation circuit.

12. The analog/digital converter according to claim 11, wherein:
the judging circuit comprises an XNOR logic gate;
the OR circuit comprises OR logic gates; and
the AND circuit comprises by an AND logic gate.

* * * * *